(12) United States Patent
Oh

(10) Patent No.: US 12,204,220 B2
(45) Date of Patent: Jan. 21, 2025

(54) DISPLAY DEVICE AND DISPLAY SYSTEM

(71) Applicant: Samsung Display Co., LTD., Yongin-si (KR)

(72) Inventor: Eon Seok Oh, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/942,250

(22) Filed: Sep. 12, 2022

(65) Prior Publication Data
US 2023/0288768 A1    Sep. 14, 2023

(30) Foreign Application Priority Data

Mar. 11, 2022  (KR) .................. 10-2022-0030508

(51) Int. Cl.
| G02F 1/137 | (2006.01) |
| G02C 7/10 | (2006.01) |
| G02F 1/01 | (2006.01) |
| G02F 1/1333 | (2006.01) |
| G06F 3/041 | (2006.01) |

(Continued)

(52) U.S. Cl.
CPC ............ G02F 1/137 (2013.01); G02C 7/101 (2013.01); G02F 1/0136 (2013.01); G02F 1/13338 (2013.01); G06F 3/0412 (2013.01); H10K 59/50 (2023.02); *G02F 1/133512* (2013.01);

(Continued)

(58) Field of Classification Search
CPC .... G06F 3/0446; G06F 3/0445; G06F 3/0412; G02F 1/133603; G02F 1/133514; G02F 1/133512; G02F 1/13338; G02F 1/0136; G02F 1/137; H10K 59/40; H10K 59/35; H10K 59/122; H10K 59/50; G02C 7/101
See application file for complete search history.

(56) References Cited

U.S. PATENT DOCUMENTS

| 10,297,779 B1 | 5/2019 | Xing |
| 2016/0252785 A1* | 9/2016 | Kimura ............ G02F 1/133512 349/12 |

(Continued)

FOREIGN PATENT DOCUMENTS

| KR | 10-1562285 | 10/2015 |
| KR | 10-2021-0081786 | 7/2021 |
| KR | 10-2319769 | 10/2021 |

OTHER PUBLICATIONS

US 9,466,619 B2, 10/2016, Yamazaki (withdrawn)

(Continued)

*Primary Examiner* — Mariam Qureshi
(74) *Attorney, Agent, or Firm* — KILE PARK REED & HOUTTEMAN PLLC

(57) ABSTRACT

A display device includes a pixel layer disposed on a base substrate, a first inorganic insulating layer disposed on the pixel layer, a first switch electrode disposed on the first inorganic insulating layer, a liquid crystal layer disposed on the first inorganic insulating layer and the first switch electrode, a second inorganic insulating layer disposed on the liquid crystal layer, and a second switch electrode disposed on the second inorganic insulating layer to face the first switch electrode. The liquid crystal layer converts light emitted from the pixel layer into about 90 degree linearly polarized light by an electric field formed between the first switch electrode and the second switch electrode in the private mode.

10 Claims, 12 Drawing Sheets

(51) Int. Cl.
  *H10K 59/50* (2023.01)
  *G02F 1/1335* (2006.01)
  *H10K 59/122* (2023.01)
  *H10K 59/35* (2023.01)
  *H10K 59/40* (2023.01)

(52) U.S. Cl.
  CPC ...... *G02F 1/133514* (2013.01); *H10K 59/122* (2023.02); *H10K 59/35* (2023.02); *H10K 59/40* (2023.02)

(56) References Cited

U.S. PATENT DOCUMENTS

| 2023/0129697 A1* | 4/2023 | Murata | G02F 1/133531 |
| | | | 349/56 |
| 2023/0236448 A1* | 7/2023 | Murata | G02F 1/133514 |
| | | | 349/33 |

OTHER PUBLICATIONS

Rui Bao et al., "Photo-polymerization of liquid crystalline monomer in oriented liquid crystal phase", Chinese Chemical Letters, Mar. 1, 2020, pp. 1330-1333, vol. 21, No. 11.

* cited by examiner

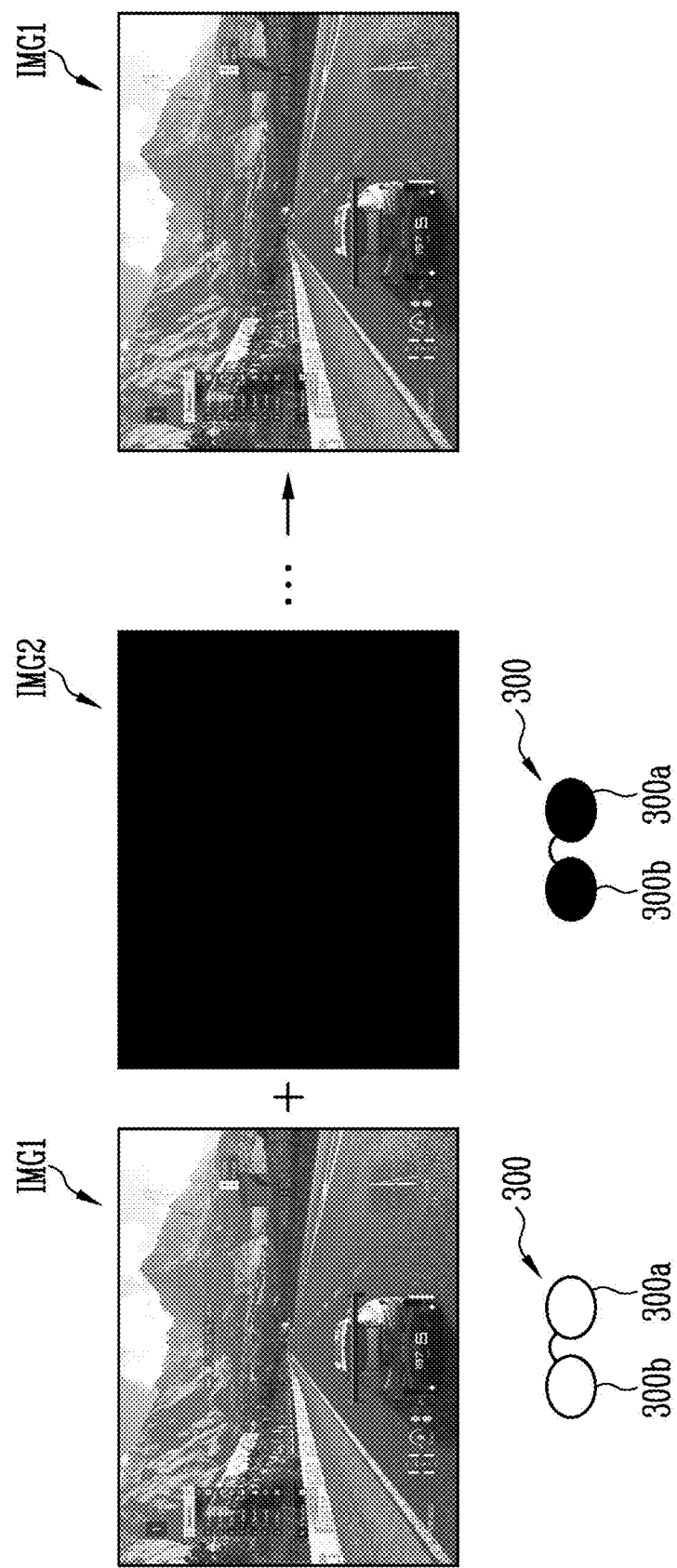

DISPLAY DEVICE AND DISPLAY SYSTEM

CROSS-REFERENCE TO RELATED APPLICATION

This application claims priority to and benefits of Korean Patent Application No. 10-2022-0030508 under 35 U.S.C. § 119, filed on Mar. 11, 2022 in the Korean Intellectual Property Office (KIPO), the entire contents of which are incorporated herein by reference.

BACKGROUND

1. Technical Field

The disclosure relates to a display device and a display system.

2. Description of the Related Art

As information technology has developed, importance of a display device, which is a connection medium between a user and information, has been highlighted. Accordingly, a use of display devices such as a liquid crystal display device, an organic light emitting display device, and the like has been increasing.

Recently, as a use of portable display devices such as a mobile phone, a tablet PC, a laptop computer, and the like has rapidly increased, protection of user's privacy in public places is emerging as a new task.

In order to protect the user's privacy, various methods for preventing people around a display device from normally viewing an image of the display device except for a user using the display device are being researched.

SUMMARY

The disclosure has been made in an effort to provide a display device having a private mode in which only a user wearing shutter glasses may normally view an image of the display device.

An embodiment provides a display device selectively driven in a general mode or a private mode. The display device may include a pixel layer disposed on a base substrate, a first inorganic insulating layer disposed on the pixel layer, a first switch electrode disposed on the first inorganic insulating layer, a liquid crystal layer disposed on the first inorganic insulating layer and the first switch electrode, a second inorganic insulating layer disposed on the liquid crystal layer, and a second switch electrode disposed on the second inorganic insulating layer to face the first switch electrode.

The liquid crystal layer may convert light emitted from the pixel layer into about 90 degree linearly polarized light by an electric field formed between the first switch electrode and the second switch electrode in the private mode.

The pixel layer may include a pixel defining film partitioning a first light emitting area, a second light emitting area, and a third light emitting area.

The first switch electrode and the second switch electrode may be disposed to overlap the pixel defining film in a thickness direction of the pixel defining film.

The display device may further include a touch sensor layer on the second inorganic insulating layer.

The touch sensor layer may include a touch electrode, a low refractive index flat layer covering the touch electrode, and a touch insulating layer disposed on the touch electrode and the low refractive index flat layer.

A refractive index of the low refractive index flat layer may be smaller than a refractive index of the touch insulating layer.

The display device may further include a second buffer layer covering the second switch electrode between the second inorganic insulating layer and the touch sensor layer.

The display device may further include a black matrix and a color filter on the touch sensor layer, wherein the first switch electrode and the second switch electrode may overlap the black matrix in a thickness direction of the black matrix.

Another embodiment provides a display device selectively driven in a general mode or a private mode. The display device may include a pixel layer disposed on a base substrate; an encapsulation layer disposed on the pixel layer; a touch electrode disposed on the encapsulation layer; a low refractive index flat layer covering the touch electrode; a first switch electrode disposed on the low refractive index flat layer to overlap the touch electrode in a thickness direction of the touch electrode; a liquid crystal layer disposed on the first switch electrode; and a second switch electrode disposed on the liquid crystal layer to face the first switch electrode.

The liquid crystal layer may convert light emitted from the pixel layer into about 90 degree linearly polarized light by an electric field formed between the first switch electrode and the second switch electrode in the private mode.

The pixel layer may include a pixel defining film partitioning a first light emitting area, a second light emitting area, and a third light emitting area.

The first switch electrode and the second switch electrode may overlap the pixel defining film in a thickness direction of the pixel defining film.

The display device may further include a black matrix and a color filter on the liquid crystal layer, wherein the black matrix may cover the second switch electrode.

Another embodiment provides a display system selectively driven in a general mode or a private mode. The display system may include a display device including a pixel layer and a first liquid crystal layer disposed on the pixel layer; a private image signal generator providing image data corresponding to the general mode, or first private image data and second private image data corresponding to the private mode to the display device; and shutter glasses including a right eye shutter and a left eye shutter.

The first liquid crystal layer may convert, in the private mode, light emitted from the pixel layer into about 90 degree linearly polarized light, and the shutter glasses may open, in the private mode, both the right eye shutter and the left eye shutter in a first private frame, and may close both the right eye shutter and the left eye shutter in a second private frame.

The first private frame and the second private frame may be alternately provided in units of frames.

A first private image corresponding to the first private image data may be a normal image, and a second private image corresponding to the second private image data may be one of a black image, an inverted image of the first private image, and a noise image.

Each of the right eye shutter and the left eye shutter may include a first polarizing plate, a second liquid crystal layer, and a second polarizing plate, and the second liquid crystal layer may be disposed between the first polarizing plate and the second polarizing plate.

The first polarizing plate and the second polarizing plate may be about 90 degree linear polarizers.

In case that the right eye shutter and the left eye shutter are opened, the second liquid crystal layer may pass light incident from the first polarizing plate without changing a vibration direction of the light incident, and in case that the right eye shutter and the left eye shutter are closed, the second liquid crystal layer may delay the vibration direction of the light incident from the first polarizing plate by about 90 degrees.

The display device may include the pixel layer disposed on a base substrate, a first inorganic insulating layer disposed on the pixel layer, a first switch electrode disposed on the first inorganic insulating layer, the first liquid crystal layer disposed on the first inorganic insulating layer and the first switch electrode, a second inorganic insulating layer disposed on the first liquid crystal layer, and a second switch electrode disposed on the second inorganic insulating layer to face the first switch electrode.

The display device may include the pixel layer disposed on a base substrate, an encapsulation layer disposed on the pixel layer, a touch electrode disposed on the encapsulation layer, a low refractive index flat layer covering the touch electrode, a first switch electrode disposed on the low refractive index flat layer and overlapping the touch electrode in a thickness direction of the touch electrode, the first liquid crystal layer disposed on the first switch electrode, and a second switch electrode disposed on the first liquid crystal layer to face the first switch electrode.

According to an embodiment, the display device may be possible to provide a private mode in which only a user of the display device may normally view an image of the display device by synchronizing operations of liquid crystal layers of shutter glasses and of the display device.

Effects of embodiments of the disclosure are not limited by what is illustrated in the above, and more various effects may be included in the specification.

BRIEF DESCRIPTION OF THE DRAWINGS

FIG. 6A is a schematic drawing for explaining an image viewed by a user using shutter glasses in case that the display system of FIG. 1 operates in a private mode.

DETAILED DESCRIPTION OF THE EMBODIMENTS

Figure 1:
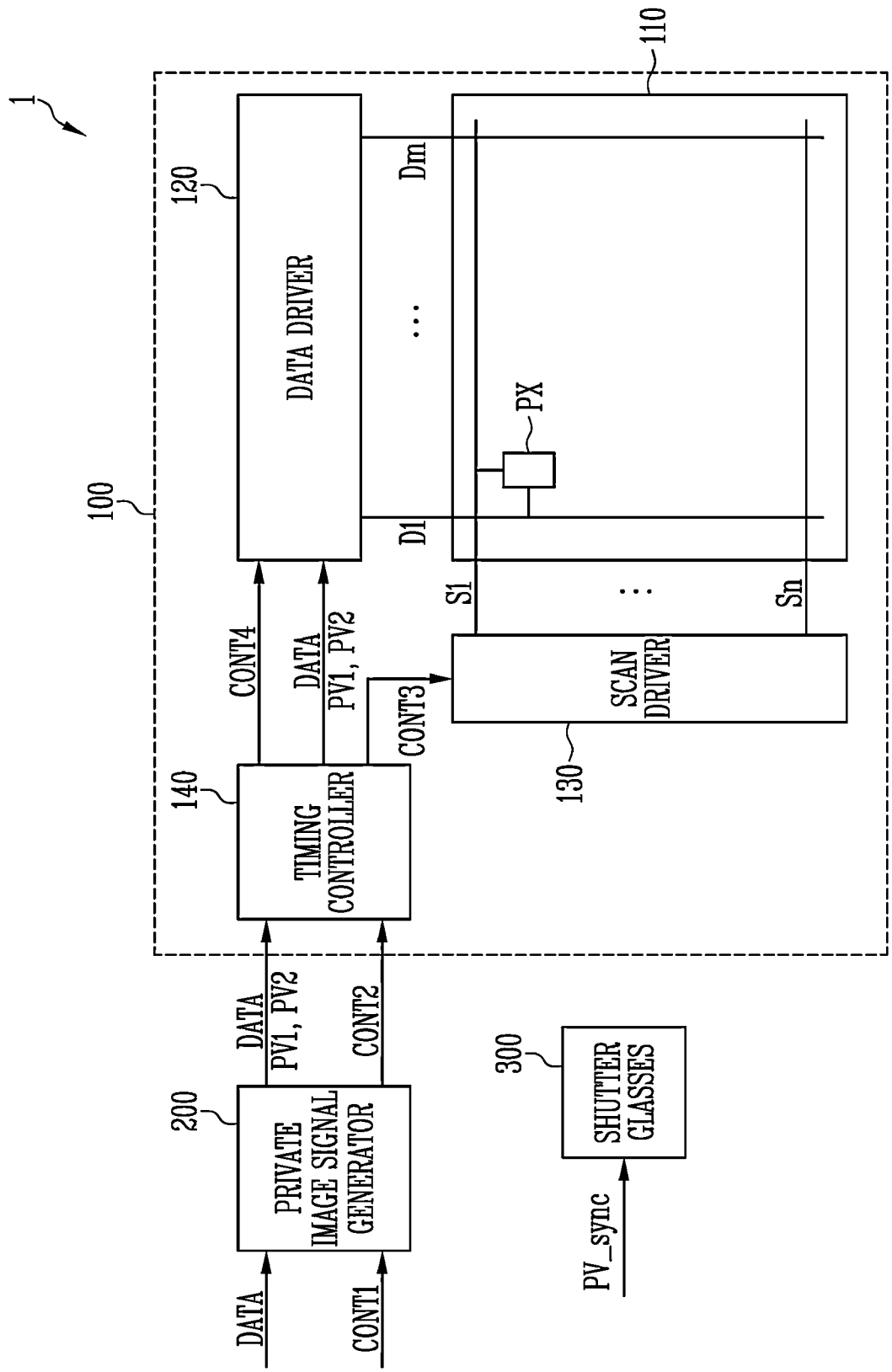
FIG. 1 illustrates a schematic block diagram of a display system according to an embodiment of the disclosure.

Advantages and features of the disclosure and methods of accomplishing a same may be understood more readily by reference to a following detailed description of preferred embodiments and accompanying drawings. However the disclosure is not limited to the embodiments described hereinafter, and may be embodied in many different forms, and the following embodiments are provided to make the disclosure of the disclosure complete and to allow those skilled in an art to clearly understand a scope of the disclosure, and the disclosure is defined by a scope of an appended claims.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

It will be understood that in case that an element or a layer is referred to as being 'on' another element or layer, it can be directly on another element or layer, or intervening element or layer may also be present. Throughout a specification, same reference numerals denote same constituent elements. Shapes, sizes, ratios, angles, numbers, and the like disclosed in the drawings for describing embodiments of the disclosure are illustrative, and thus the disclosure is not limited to the illustrated embodiments.

Although terms "first," "second," and the like are used to describe various constituent elements, these constituent elements are not limited by these terms. These terms are used to distinguish one constituent element from another constituent element. Therefore, first constituent elements described below may be second constituent elements within a technical spirit of the disclosure.

A use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

When a component is described herein to "connect" another component to the other component or to be "connected to" other components, the components may be connected to each other as separate elements, or the components may be integral with each other.

The phrase "at least one of" is intended to include the meaning of "at least one selected from the group of" for the purpose of its meaning and interpretation. For example, "at least one of A and B" may be understood to mean "A, B, or A and B."

Each of the features of the various embodiments of the disclosure may be coupled or combined with each other partly or entirely, and may be technically variously interlocked and driven in a manner that is sufficiently understandable to those skilled in the art. Each embodiment may be practicable independently of each other, and may be practicable with together in an interrelationship.

Unless otherwise defined or implied herein, all terms (including technical and scientific terms) used have a same meaning as commonly understood by those skilled in the art to which this disclosure pertains. It will be further understood that terms, such as those defined in commonly used dictionaries, should be interpreted as having a meaning that is consistent with their meaning in a context of the relevant art and should not be interpreted in an ideal or excessively formal sense unless clearly defined in the specification.

Hereinafter, specific embodiments will be described with reference to the accompanying drawings.

Figure 2:
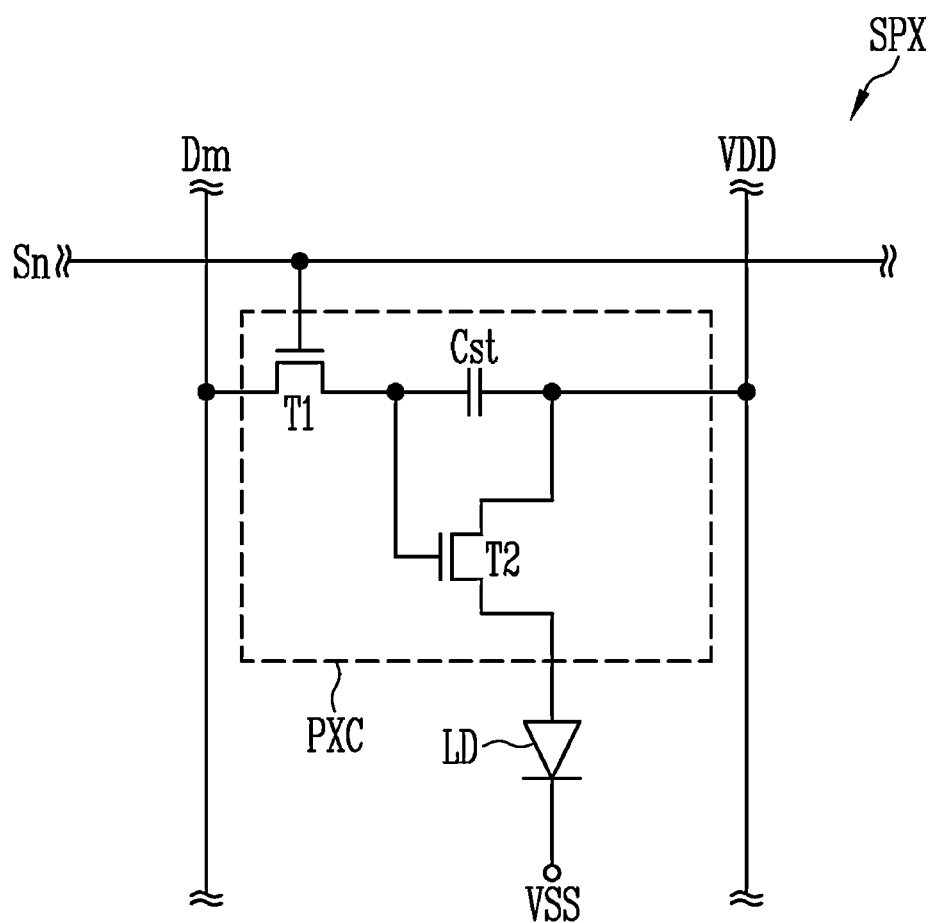
FIG. 2 is a schematic drawing for explaining a pixel according to an embodiment of the disclosure.

FIG. 1 illustrates a schematic block diagram of a display system according to an embodiment of the disclosure. FIG. 2 is a schematic drawing for explaining a pixel according to an embodiment of the disclosure.

Referring to FIG. 1, a display system 1 may include a display device 100, a private image signal generator 200, and shutter glasses 300.

The display device 100 may be a rigid display or a flexible display. The display device 100 may be a portable electronic device, such as a mobile phone, a tablet PC, a laptop computer, a game device, and the like. However, the disclosure is not limited to a specific type of the display device 100. For example, in another embodiment of the disclosure, the display device 100 may be used in a large electronic device such as a television, and a small or medium electronic device such as a car navigation device, a smart watch, or a camera.

The display device 100 may include a display panel 110 displaying an image, a data driver 120 and a scan driver 130 which are driving the display panel 110, and a timing controller 140 controlling the data driver 120 and the scan driver 130.

The private image signal generator 200 may receive image data DATA and a first control signal CONT1 from an outside. The private image signal generator 200 may generate first private image data PV1 and second private image data PV2 based on the image data DATA, and may transmit the first private image data PV1 and the second private image data PV2 to the timing controller 140. The first control signal CONT1 may include a general image enable signal for displaying a general image or a private image enable signal for displaying a private image.

The timing controller 140 may receive the image data DATA, the first private image data PV1, the second private image data PV2, and a second control signal CONT2 from the private image signal generator 200. The second control signal CONT2 may include a panel driving signal for displaying the general image.

The timing controller 140 may select whether to operate in a general mode or a private mode in response to the panel driving signal. The timing controller 140 may output the image data DATA in the general mode, and may output the first private image data PV1 and the second private image data PV2 in the private mode.

The second control signal CONT2 received by the timing controller 140 may include a main clock signal, a vertical synchronization signal, a horizontal synchronization signal, an image enable signal, and the like in addition to the panel driving signal. The timing controller 140 may generate a third control signal CONT3 for controlling an operation of the scan driver 130 and a fourth control signal CONT4 for controlling an operation of the data driver 120 based on the second control signal CONT2, and may provide the third control signal CONT3 and the fourth control signal CONT4 to the scan driver 130 and the data driver 120, respectively.

The display panel 110 may include a self-light emitting element. In an embodiment, the self-light emitting element may include at least one of an organic light emitting diode, a quantum dot light emitting diode, an inorganic material-based micro light emitting diode (for example, a micro LED), and inorganic material-based nano light emitting diodes (for example, a nano LED). Hereinafter, for better comprehension and ease of description, a case in which the self-light emitting element is the organic light emitting diode will be described as an example. The display panel 110 may include a first light emitting area EA1, a second light emitting area EA2, and a third light emitting area EA3 (EA1, EA2, and EA3 of FIG. 3).

The display panel 110 may include scan lines S1 to Sn for receiving a gate signal and data lines D1 to Dm for receiving a data voltage. The scan lines S1 to Sn and the data lines D1 to Dm may be insulated from each other, and may cross each other. FIG. 1 illustrates a pixel PX connected to one of the scan lines S1 to Sn and one of the data lines D1 to Dm as an example. The configuration of the pixel PX is not limited thereto, and may be modified and implemented.

Referring to FIG. 2, a sub-pixel SPX may include a light emitting element LD and a pixel driving circuit PXC for driving the light emitting element LD. The light emitting element LD may be a front light emitting diode or a rear light emitting diode. The pixel driving circuit PXC may include a first transistor T1 (or a switching transistor), a second transistor T2 (or a driving transistor), and a capacitor Cst. A first power voltage VDD may be provided to the second transistor T2, and a second power voltage VSS may be provided to the light emitting element LD. The second power voltage VSS may be lower than the first power voltage VDD.

The first transistor T1 may output a data signal applied to the data line Dm in response to a scan signal applied to the scan line Sn. The capacitor Cst may be charged with a voltage corresponding to the data signal received from the first transistor T1.

The second transistor T2 may be connected to the light emitting element LD. The second transistor T2 may control a driving current flowing through the light emitting element LD in response to an amount of charge stored in the capacitor Cst. The light emitting element LD may emit light during a period in which the second transistor T2 is turned on.

Referring back to FIG. 1, the scan driver 130 may be electrically connected to the scan lines S1 to Sn provided in the display panel 110 to provide a scan signal to the scan lines S1 to Sn. For example, the scan driver 130 may generate a scan signal for driving the scan lines S1 to Sn based on the third control signal CONT3 received from the timing controller 140, and may sequentially output the generated scan signal to the scan lines S1 to Sn by at least one line part.

The third control signal CONT3 may include a scan start pulse, at least one scan shift clock, and the like. The scan start pulse may control timing of a first scan signal. The at least one scan shift clock may mean one or more clock signals for shifting the scan start pulse.

The data driver 120 may receive the image data DATA from the timing controller 140 in the general mode. The data driver 120 may sample and hold the image data DATA according to the fourth control signal CONT4, and may convert the image data DATA into an analog voltage to provide data voltages to the data lines D1 to Dm.

The data driver 120 may receive the first private image data PV1 and the second private image data PV2 from the timing controller 140 in the private mode. The data driver 120 may respectively sample and hold the first private image data PV1 and the second private image data PV2 according to the fourth control signal CONT4, and may convert the first private image data PV1 and the second private image data PV2 into analog voltages to be converted into a first private image data voltage and a second private image data voltage. The data driver 120 may provide the first private image data voltage to the data lines D1 to Dm during a first private frame, and may provide the second private image data voltage to the data lines D1 to Dm during a second private frame. The first private image data voltage and the second private image data voltage may be alternately outputted in parts of a frame (for example, one frame). For example, the first private image data voltage may be outputted in the first private frame, and the second private image data voltage may be outputted in the second private frame.

The fourth control signal CONT4 may include an output data enable signal and a horizontal start signal, but is not limited thereto.

The shutter glasses 300 may include a left eye shutter (not shown) and a right eye shutter (not shown). The shutter glasses 300 may receive a private synchronization signal PV_Sync, and may open both the left eye shutter and the right eye shutter during the first private frame in response to the private synchronization signal PV_Sync, and may close both the left eye shutter and the right eye shutter during the second private frame. Here, the private synchronization signal PV_Sync may be a signal synchronized with the driving timing of the display panel 110. Accordingly, in case that a user wears the shutter glasses 300, the user may view the private image displayed on the display panel 110 through the left eye shutter and the right eye shutter thereof.

Figure 3:
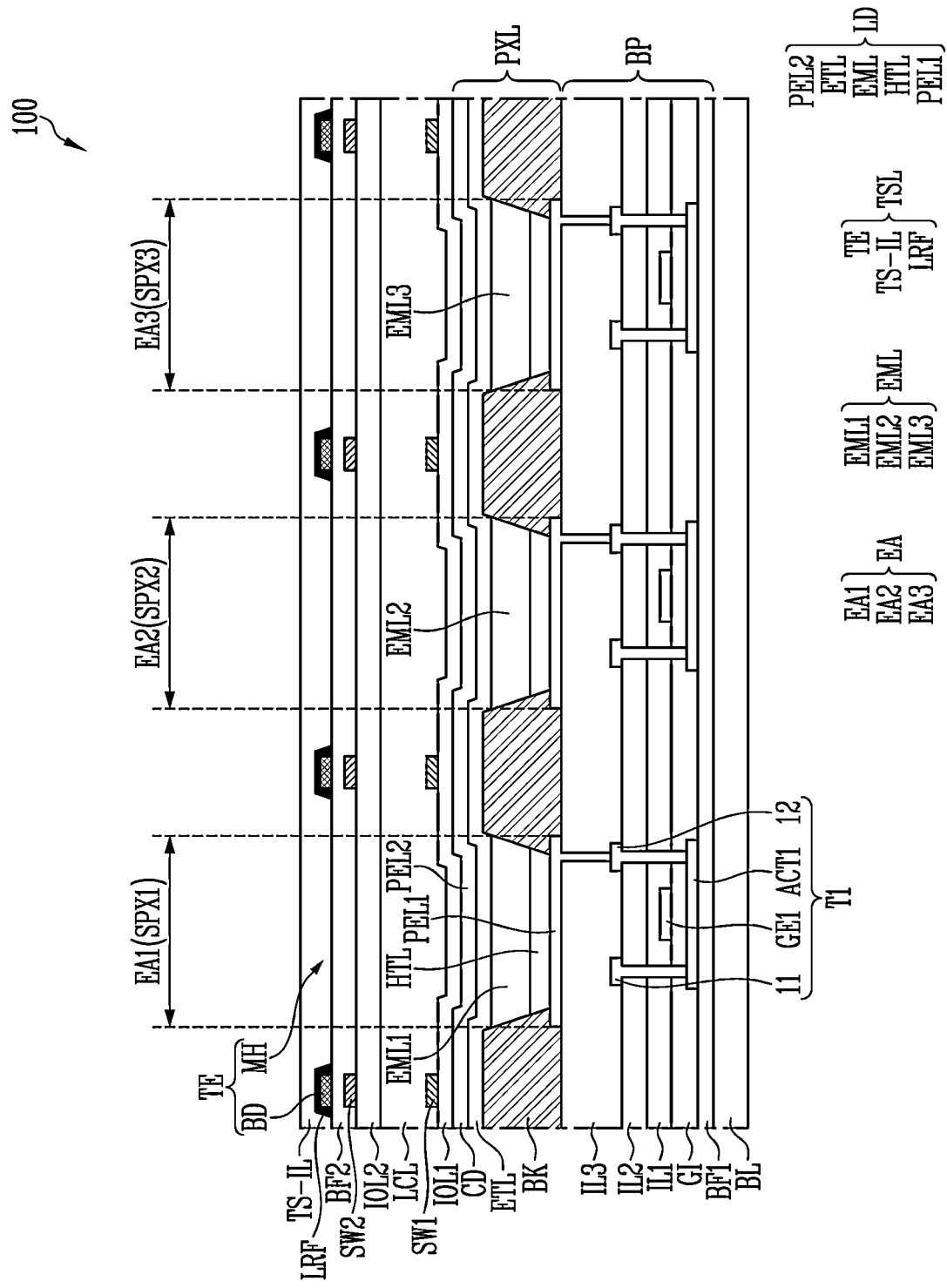
FIG. 3 illustrates a schematic cross-sectional view of an embodiment of a display device of FIG. 1.

FIG. 3 illustrates a schematic cross-sectional view of an embodiment of a display device of FIG. 1.

Referring to FIG. 1 and FIG. 3, the display device 100 may include a base substrate BL, a backplane structure BP, a pixel layer PXL, a first inorganic insulating layer IOL1, a liquid crystal layer LCL, and a second inorganic insulating layer IOL2. The display device 100 may further include a touch sensor layer TSL on the second inorganic insulating layer IOL2.

The schematic cross-sectional view of FIG. 3 shows a partial configuration of the pixel PX of FIG. 1. The pixel PX according to an embodiment may include a first sub-pixel SPX1, a second sub-pixel SPX2, and a third sub-pixel SPX3. Configurations in a light emitting layer EML of the first sub-pixel SPX1, the second sub-pixel SPX2, and the third sub-pixel SPX3 may be different from each other and the remaining configurations thereof may be substantially a same as each other in FIG. 3. Thus the first sub-pixel SPX1 will be mainly described and duplicate descriptions will be omitted.

The first transistor T1 of the first sub-pixel SPX1 may include an active pattern ACT1, a gate electrode GE1, a source electrode 11, and a drain electrode 12.

The base substrate BL may be made of an insulating material such as a resin. The base substrate BL may be made of a flexible material to be bendable or foldable, and may have a single-layered structure or a multi-layered structure. For example, the base substrate BL may be made of a plastic film such as a polyimide film.

The backplane structure BP including the pixel driving circuit PXC may be provided on the base substrate BL. The backplane structure BP may include a semiconductor layer (e.g., active pattern ACT1), conductive layers (e.g., the gate electrode GE1, the source electrode 11, and the drain electrode 12), and insulating layers (e.g., a gate insulating layer GI, a first insulating layer ILL a second insulating layer IL2, and a third insulating layer IL3).

A first buffer layer BF1 may be formed on the base substrate BL. The first buffer layer BF1 may prevent impurities from being diffused into the transistor T1. The first buffer layer BF1 may be omitted depending on a material and process conditions of the base substrate BL.

The semiconductor layer including the active pattern ACT1 may be provided on the first buffer layer BF1. In an embodiment, the semiconductor layer may include a poly-silicon semiconductor. For example, the semiconductor layer may be formed through a low temperature poly-silicon process (for example, a low temperature poly-silicon (LTPS) process). However, this is merely an example, and at least a portion of the semiconductor layer may be formed of an oxide semiconductor, a metal oxide semiconductor, or the like.

The gate insulating layer GI may be provided on the semiconductor layer. The gate insulating layer GI may be an inorganic insulating layer made of an inorganic material.

A first conductive layer including the gate electrode GE1 may be provided on the gate insulating layer GI. The gate electrode GE1 may cover an area corresponding to a channel area of the active pattern ACT1.

The first conductive layer including the gate electrode GE1 may be made of metal. For example, the first conductive layer may be made of at least one of metals such as gold (Au), silver (Ag), aluminum (Al), molybdenum (Mo), chromium (Cr), titanium (Ti), nickel (Ni), neodymium (Nd), and copper (Cu), or an alloy thereof. The first conductive layer may be formed as a single layer or a multilayer in which two or more materials of metals and alloys are stacked with each other.

The first insulating layer IL1 (or a first interlayer insulating layer) may be provided on the first conductive layer. The first insulating layer IL1 may be an inorganic insulating layer made of an inorganic material. As the inorganic material, a polysiloxane, a silicon nitride, a silicon oxide, or a silicon oxynitride may be used.

A second conductive layer may be provided on the first insulating layer IL1. The second conductive layer may be made of at least one of metals such as gold (Au), silver (Ag), aluminum (Al), molybdenum (Mo), chromium (Cr), titanium (Ti), nickel (Ni), neodymium (Nd), and copper (Cu), or an alloy thereof. The second conductive layer may be formed as a single layer, but is not limited thereto, and may be formed as a multilayer in which two or more materials among metals and alloys are stacked with each other.

The second insulating layer IL2 (or a second interlayer insulating layer) may be provided on the second conductive layer. The second insulating layer IL2 may be an inorganic insulating layer made of an inorganic material. As the inorganic material, a polysiloxane, a silicon nitride, a silicon oxide, or a silicon oxynitride may be used.

A third conductive layer including the source electrode 11 and the drain electrode 12 may be provided on the second insulating layer IL2.

The source electrode 11 and the drain electrode 12 may contact a source area and a drain area at sides of the active pattern ACT1 through contact holes formed in the gate insulating layer GI, the first insulating layer ILL and the second insulating layer IL2.

The third conductive layer including the source electrode 11 and the drain electrode 12 may be made of metal. For example, the third conductive layer may be made of at least one of metals such as gold (Au), silver (Ag), aluminum (Al), molybdenum (Mo), chromium (Cr), titanium (Ti), nickel (Ni), neodymium (Nd), and copper (Cu), or an alloy thereof.

Although not shown in FIG. 3, in an embodiment, a passivation layer may be further provided on the third conductive layer. The passivation layer may be an inorganic insulating layer made of an inorganic material. As the inorganic material, a polysiloxane, a silicon nitride, a silicon oxide, or a silicon oxynitride may be used.

The third insulating layer IL3 may be provided on the third conductive layer (or the passivation layer). In an embodiment, the third insulating layer IL3 may be an organic insulating layer made of an organic material. As the organic material, an organic insulating material such as a polyacryl-based compound, a polyimide-based compound, a fluorine-based carbon compound such as Teflon, and a benzocyclobutene compound may be used. As another example, the third insulating layer IL3 may be an inorganic insulating layer made of an inorganic material.

FIG. 3 illustrates that the third insulating layer IL3 may be provided on the second insulating layer IL2, but an insulating layer may be variously disposed. For example, only the passivation layer may be provided on the source and drain electrodes 11 and 12, and a first pixel electrode PEL1 may be provided on the passivation layer.

The pixel layer PXL may be provided on the backplane structure BP. The pixel layer PXL may include a light emitting element LD connected to a pixel circuit (PXC of FIG. 2).

In an embodiment, the light emitting element LD may include the first pixel electrode PEL1, a hole transport layer HTL, a first light emitting layer EML1, an electron transport layer ETL, and a second pixel electrode PEL2.

In an embodiment, the first pixel electrode PEL1 may be made of a metal layer such as silver (Ag), magnesium (Mg), aluminum (Al), platinum (Pt), lead (Pd), gold (Au), nickel (Ni), neodymium (Nd), iridium (Ir), and chromium (Cr), and an alloy thereof and/or an indium tin oxide (ITO), an indium zinc oxide (IZO), a zinc oxide (ZnO), and indium tin zinc oxide (ITZO). The first pixel electrode PEL1 may be connected to the drain electrode 12 through a contact hole.

A bank layer BK (or a pixel defining film) partitioning a first light emitting area EA1, a second light emitting area EA2, and a third light emitting area EA3 may be provided on the third insulating layer IL3 on which the first pixel electrode PEL1 is formed.

The bank layer BK may be an organic insulating layer made of an organic material. The organic material may include an acryl resin, an epoxy resin, a phenolic resin, a polyamide resin, a polyimide resin, or the like.

The bank layer BK may include a light absorbing material, or may serve to absorb light introduced from an outside by a light absorbing agent being applied thereon. For example, the bank layer BK may include a carbon-based black pigment. However, it is not limited thereto, and the bank layer BK may include an opaque metallic material such as chromium (Cr), molybdenum (Mo), an alloy (MoTi) of molybdenum and titanium, tungsten (W), vanadium (V), niobium (Nb), tantalum (Ta), manganese (Mn), cobalt (Co), or nickel (Ni), or a combination thereof, which has a high light absorption rate.

The bank layer BK may expose an upper surface of the first pixel electrode PEL1, and may protrude from the third insulating layer IL3 along a circumference of the light emitting area EA (e.g., the first light emitting area EA1, the second light emitting area EA2, or the third light emitting area EA3). For example, the bank layer BK may include openings corresponding to the light emitting area EA.

The hole transport layer HTL may be provided on the upper surface of the first pixel electrode PEL1 exposed by the bank layer BK. Through the hole transport layer HTL, holes may move to the light emitting layer EML.

The light emitting layer EML may be provided on the hole transport layer HTL in the light emitting area EA surrounded by the bank layer BK. In an embodiment, the light emitting layer EML may be configured as an organic light emitting layer. Depending on an organic material included in the light emitting layer EML, the light emitting layer EML may emit light such as red light, green light, or blue light. For example, the first light emitting layer EML1 of the first sub-pixel SPX1 may emit red light, the second light emitting layer EML2 of the second sub-pixel SPX2 may emit green light, and the third light emitting layer EML3 of the third sub-pixel SPX3 may emit blue light.

In an embodiment, the electron transport layer ETL may be provided on the light emitting layer EML. The electron transport layer ETL may be integrally formed. Accordingly, the electron transport layer ETL may contact an upper surface of the bank layer BK.

However, this is an example, and at least one of the hole transport layer HTL and the electron transport layer ETL may be omitted. A functional layer such as a hole injection layer HIL and an electron injection layer EIL may be added.

The second pixel electrode PEL2 may be provided on the electron transport layer ETL of the light emitting area EA. In an embodiment, the second pixel electrode PEL2 and common electrode CD may be integral with each other. A second power voltage VSS may be supplied to the second pixel electrode PEL2.

The second pixel electrode PEL2 may be made of a metal layer such as silver (Ag), magnesium (Mg), aluminum (Al), platinum (Pt), lead (Pd), gold (Au), nickel (Ni), neodymium (Nd), iridium (Ir), or chromium (Cr), or a combination thereof, and/or a transparent conductive layer such as ITO, IZO, ZnO, or ITZO. In an embodiment, the common electrode CD may be formed of a multilayer of a double layer or more including a thin metal layer, for example, a triple layer of ITO/Ag/ITO.

The first inorganic insulating layer IOL1 may be formed on the common electrode CD including the second pixel electrode PEL2. The liquid crystal layer LCL may be formed on the first inorganic insulating layer IOL1. The second inorganic insulating layer IOL2 may be formed on the liquid crystal layer LCL.

The first inorganic insulating layer IOL1 and the second inorganic insulating layer IOL2 may be formed by including one or more material(s) selected from a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride (SiON). The first inorganic insulating layer IOL1 and the second inorganic insulating layer IOL2 may be formed by a chemical vapor deposition method.

The liquid crystal layer LCL may include liquid crystal molecules. For example, the liquid crystal layer LCL may be provided in which liquid crystal molecules having dielectric anisotropy are arranged. The liquid crystal molecules are not particularly limited as long as they are typically used liquid crystal molecules. For example, the liquid crystal molecule may include an alkenyl-based liquid crystal compound, an alkoxy-based liquid crystal compound, or the like. The liquid crystal molecule may have a negative dielectric anisotropy or a positive dielectric anisotropy, but is not limited thereto.

The liquid crystal layer LCL may be a polymer dispersed liquid crystal layer such as a polymer dispersed liquid crystal (PDLC) and a polymer dispersed liquid crystal (PNLC), or a combination thereof. The polymer dispersed liquid crystal layer may include disorderly arranged liquid crystals in a polymer matrix. As described above, since the polymer dispersed liquid crystal layer has the liquid crystals arranged disorderly in the polymer matrix, in case that an electric field is not formed, light irradiated from an outside to the polymer dispersed liquid crystal layer may be scattered.

In case that the electric field is formed, the liquid crystals disorderly arranged in the polymer matrix included in the polymer dispersed liquid crystal layer may be arranged in a line by the electric field, and because of this, a vibration direction of the light irradiated from the outside to the polymer dispersed liquid crystal layer may be changed.

According to an embodiment, a first switch electrode SW1 may be disposed on the first inorganic insulating layer IOL1 to overlap the bank layer BK in a thickness direction thereof (or in a plan view). A second switch electrode SW2 may be disposed on the second inorganic insulating layer IOL2 to overlap the first switch electrode SW1 in a thickness direction thereof (or in a plan view). However, shapes of the first switch electrode SW1 and the second switch electrode SW2 are not limited thereto, the first switch electrode SW1 may be integrally formed on the entire area of the first inorganic insulating layer IOL1, and the second switch electrode SW2 may be integrally formed on the entire area of the second inorganic insulating layer IOL2. The first switch electrode SW1 and the second switch electrode SW2 may be formed of a transparent conductive layer such as an indium tin oxide (ITO), an indium zinc oxide (IZO), a zinc oxide (ZnO), or an indium tin zinc oxide (ITZO).

The arrangement of liquid crystal molecules in the liquid crystal layer LCL may vary according to an electrical signal applied between the first switch electrode SW1 and the second switch electrode SW2.

According to an embodiment, in a general mode, since an electric field is not formed between the first switch electrode SW1 and the second switch electrode SW2, the liquid crystal molecules have irregular directions, so that light emitted from the light emitting layer EML may be scattered by the liquid crystal molecules. Accordingly, an image displayed on the display device 100 may have a wide viewing angle.

According to an embodiment, in a private mode, since the electric field is formed between the first switch electrode SW1 and the second switch electrode SW2, the liquid crystal molecules have a constant direction, so that a vibration direction of light emitted from the light emitting layer EML may be changed by the liquid crystal molecules. Accordingly, the light emitted from the light emitting layer EML may be outputted on the display device 100 as about 90 degree linearly polarized light. A reason why only a user of the display device 100 may normally view an image displayed on a display panel 110 by using shutter glasses 300 will be described in detail below with reference to FIG. 4 to FIG. 6B.

The display device 100 may further include the touch sensor layer TSL on the second inorganic insulating layer IOL2. According to an embodiment, a second buffer layer BF2 may be further included between the second inorganic insulating layer IOL2 and the touch sensor layer TSL. The second buffer layer BF2 may be formed on the second switch electrode SW2 and the second inorganic insulating layer IOL2. The second buffer layer BF2 may include an inorganic layer or an organic insulating layer.

According to an embodiment, the touch sensor layer TSL may include a touch electrode TE, a low refractive index flat layer LRF, and a touch insulating layer TS_IL. In FIG. 3, for better understanding and ease of description, the touch sensor layer TSL is illustrated as a single-layered structure for acquiring coordinate information by a cell cap method, but the touch sensor layer TSL may include touch insulating layers and touch electrode layers, and may have a double-layered structure for acquiring coordinate information by a mutual cap method.

The touch electrode TE may have a single-layered structure or a multi-layered structure. A conductive layer with the multi-layered structure may include at least two or more of transparent conductive layers and metal layers. The multi-layered conductive layer may include metal layers including different metals. For example, the transparent conductive layer may include an indium tin oxide (ITO), an indium zinc oxide (IZO), a zinc oxide (ZnO), an indium tin zinc oxide (ITZO), a PEDOT, a metal nano wire, or a graphene. The metal layer may include at least one of molybdenum (Mo), silver (Ag), titanium (Ti), copper (Cu), aluminum (Al), and an alloy thereof.

The touch electrode TE may have a mesh structure including a mesh hole MH and a body portion BD. The mesh hole MH may overlap the light emitting area EA in a thickness direction thereof (or in a plan view), and an area of the mesh hole MH may be larger than an area of the light emitting area EA. The body portion BD may overlap the bank layer BK (or the pixel defining film) in a thickness direction thereof (or in a plan view), and a width of the body portion BD may be smaller than a width of the bank layer BK. Through such a structure, light outputted from the light emitting area EA of the display panel 110 may effectively pass through the touch electrode TE.

The low refractive index flat layer LRF may have a relatively smaller refractive index than the touch insulating layer TS-IL to be described below. The low refractive index flat layer LRF may not overlap the light emitting areas EA1, EA2, and EA3, and may overlaps the non-light emitting area, in a plan view. The low refractive index flat layer LRF may overlap the bank layer BK (or the pixel defining film) in the thickness direction, in a plan view, and a width of the low refractive index flat layer LRF may be smaller than that of the bank layer BK. The low refractive index flat layer LRF may include holes in a plan view. The hole of the low refractive index flat layer LRF according to an embodiment may have a circular shape in a plan view, and light (for example, light emitted from the light emitting layer EML) may be evenly emitted from all of edges of the hole.

The touch insulating layer TS-IL may be disposed on the touch electrode TE, the low refractive index flat layer LRF, and the second buffer layer BF2. The touch insulating layer TS-IL may include an inorganic or organic material. The inorganic material may include at least one of an aluminum oxide, a titanium oxide, a silicon oxide, a silicon oxynitride, a zirconium oxide, and a hafnium oxide. The organic material may include at least one of an acryl-based resin, a methacrylic-based resin, a polyisoprene, a vinyl-based resin, an epoxy-based resin, a urethane-based resin, a cellulose-based resin, a siloxane-based resin, a polyimide-based resin, a polyamide-based resin, and a perylene-based resin.

Figure 4:
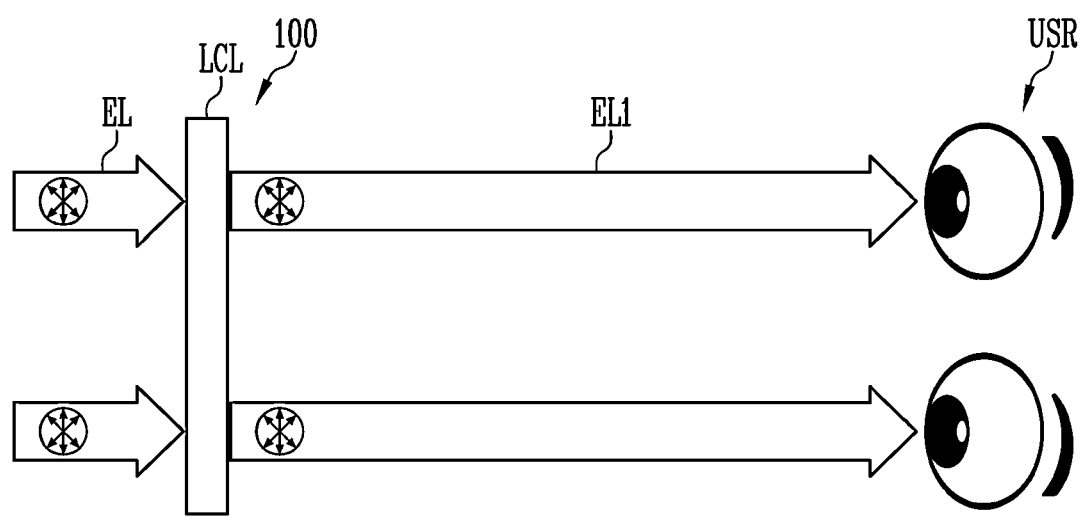
FIG. 4 is a schematic drawing for explaining a general mode of the display system of FIG. 1.

FIG. 4 is a schematic drawing for explaining the general mode of the display system of FIG. 1.

Referring to FIG. 3 and FIG. 4, emitted light EL emitted from the light emitting layer EML of the display device 100 does not vibrate in a specific direction but may vibrate in all directions. In case that the display device 100 operates in the general mode, since an electric field is not formed between the first switch electrode SW1 and the second switch electrode SW2, the liquid crystal molecules of the liquid crystal layer LCL may have an irregular directions. The emitted light EL may be scattered by the liquid crystal molecules of the liquid crystal layer LCL. Light EL1 outputted from the liquid crystal layer LCL does not vibrate in a specific direction but may vibrate in all directions. Accordingly, a user USR may view an image having a wide viewing angle.

Figure 5A:
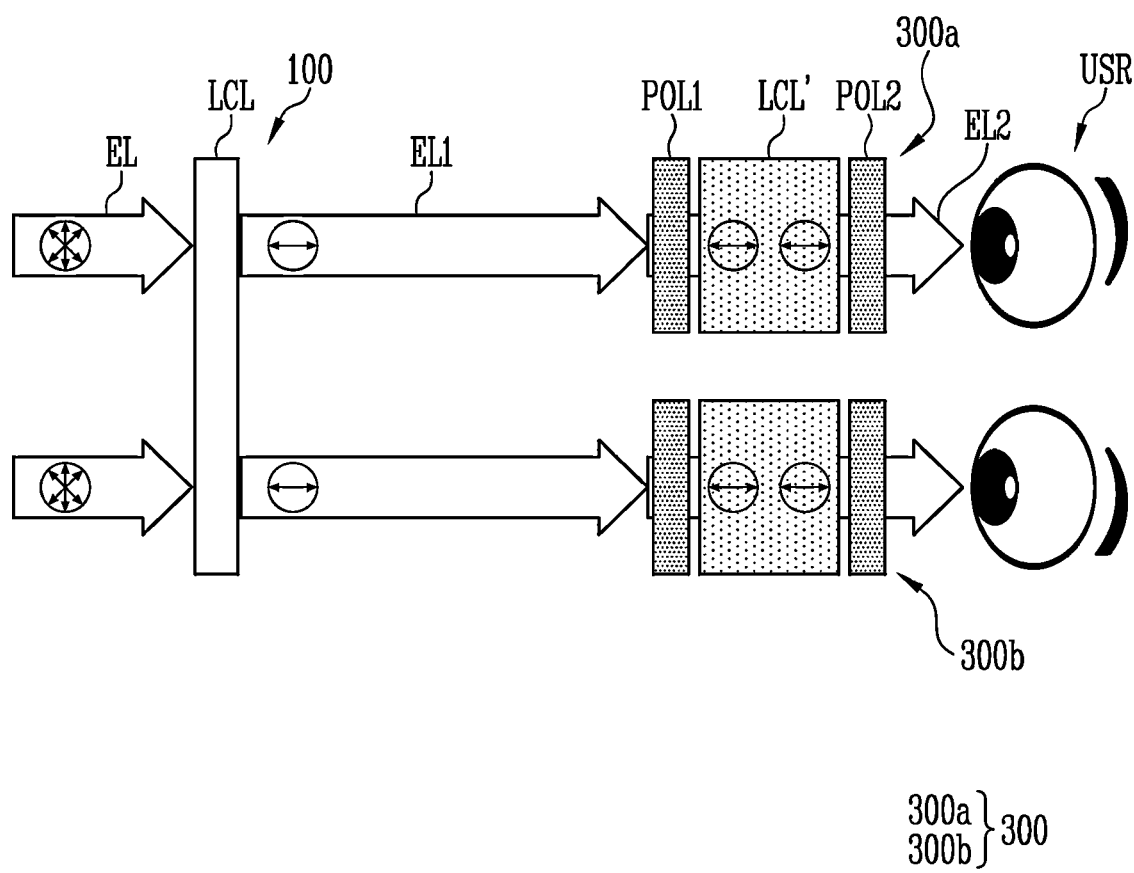
FIG. 5A and FIG. 5B are schematic drawings for explaining a private mode of the display system of FIG. 1.
Figure 5B:
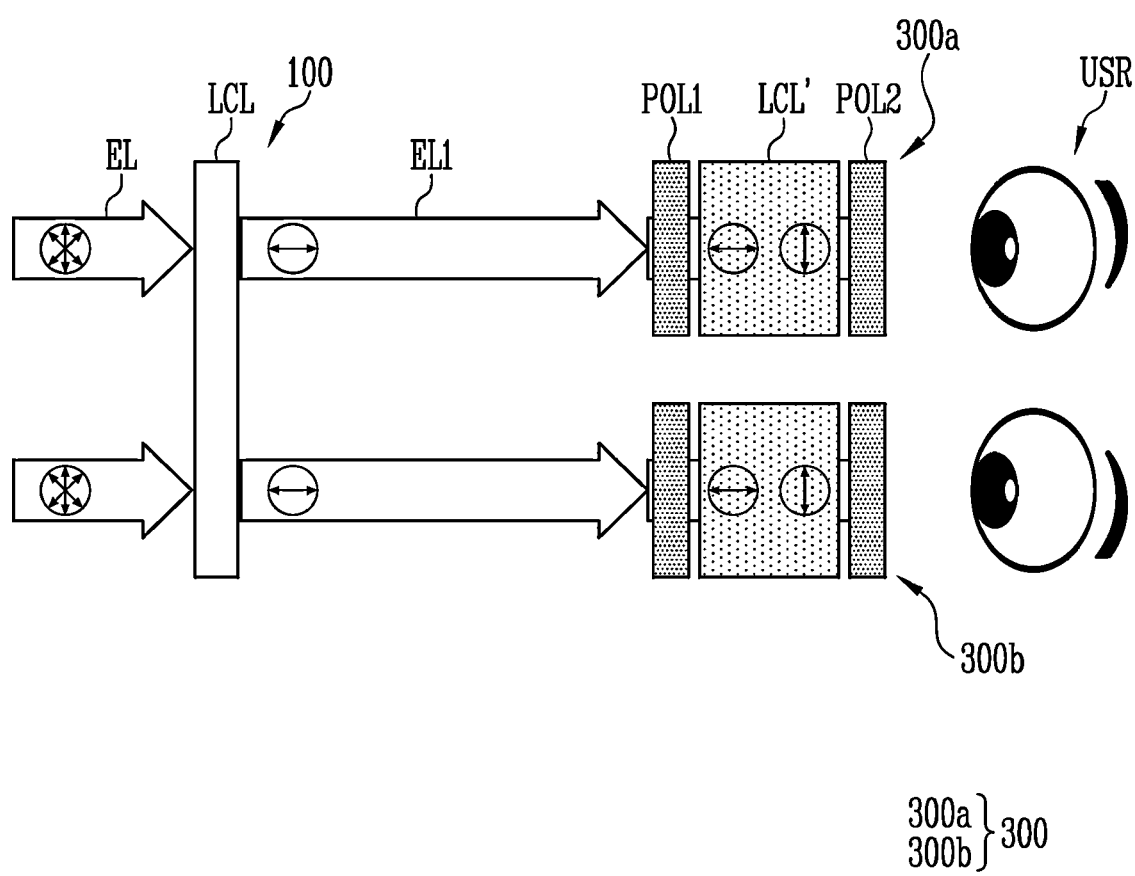
Figure 6B:
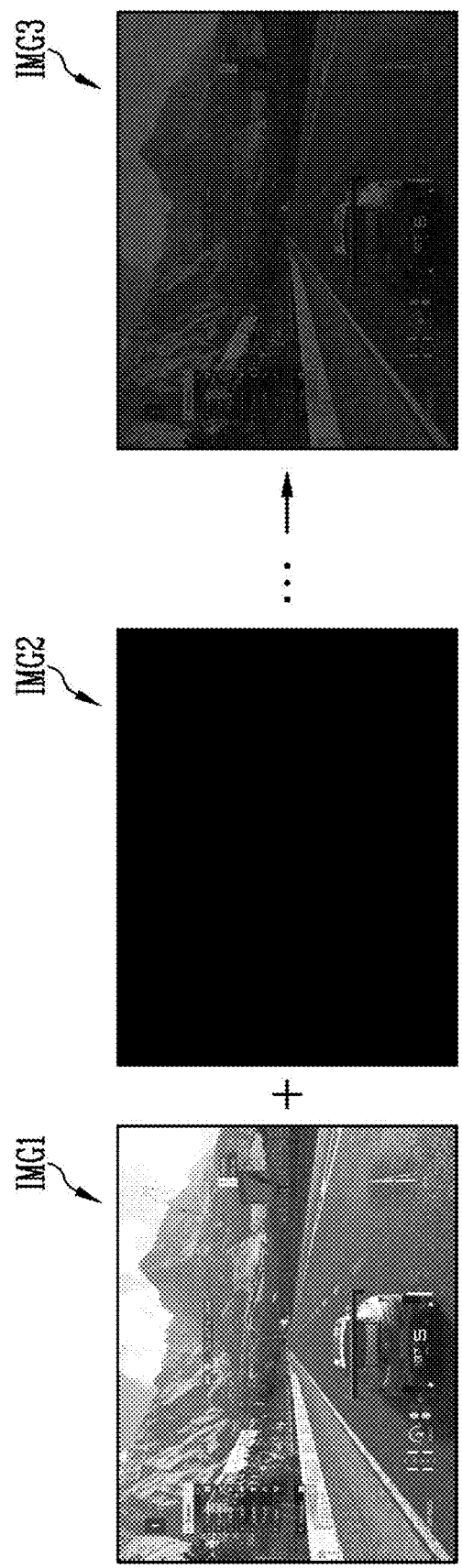
FIG. 6B is a schematic drawing for explaining an image viewed by a surrounding person who does not use shutter glasses in case that the display system of FIG. 1 operates in a private mode.

FIG. 5A and FIG. 5B are schematic drawings for explaining the private mode of the display system of FIG. 1. FIG. 6A is a schematic drawing for explaining an image visible to the user USR using shutter glasses in case that the display system of FIG. 1 operates in the private mode. FIG. 6B is a schematic drawing for explaining an image visible to a surrounding person who does not use shutter glasses in case that the display system of FIG. 1 operates in the private mode.

Referring to FIG. 1, FIG. 3, and FIG. 5A, the emitted light EL emitted from the light emitting layer EML of the display device 100 does not vibrate in a specific direction but may vibrate in all directions. In case that the display device 100 operates in the private mode, since an electric field is formed between the first switch electrode SW1 and the second switch electrode SW2, the liquid crystal molecules of the liquid crystal layer LCL may have a constant direction. A vibration direction of the emitted light EL may be changed by the liquid crystal molecules of the liquid crystal layer LCL. For example, the liquid crystal layer LCL may change the vibration direction of the emitted light EL by about 90 degrees. Accordingly, the light EL1 outputted from the liquid crystal layer LCL may be about 90 degree linearly polarized light.

The shutter glasses 300 may include a right eye shutter 300a and a left eye shutter 300b.

Each of the right eye shutter 300a and the left eye shutter 300b may include a first polarizing plate POL1, a liquid crystal layer LCL', and a second polarizing plate POL2. The liquid crystal layer LCL' may be disposed between the first polarizing plate POL1 and the second polarizing plate POL2. The first polarizing plate POL1 and the second polarizing plate POL2 according to an embodiment may be about 90 degree linear polarizers.

The light EL1 outputted from the liquid crystal layer LCL of the display device 100 may be incident on the first polarizer POL1. The first polarizer POL1 may transmit a component vibrating in a about 90 degree direction of a phase axis among components of the light EL1.

The shutter glasses 300 may receive a private synchronization signal PV_Sync, and may open both the right eye shutter 300a and the left eye shutter 300b during a first private frame in response to the private synchronization signal PV_Sync. An opening of the right eye shutter 300a and the left eye shutter 300b may mean that the liquid crystal layers LCL' of the right eye shutter 300a and the left eye shutter 300b transmit the about 90 degree linearly polarized light EL1 as it is without changing the vibration direction thereof.

The light EL1 passing through the liquid crystal layers LCL' of the right eye shutter 300a and the left eye shutter 300b may be incident on the second polarizer POL2. Since the second polarizer POL2 transmits a component that vibrates in the about 90 degree direction of the phase axis among light components, the about 90 degree linearly polarized light EL1 may pass through the second polarizer POL2. Light EL2 may be the about 90 degree linearly polarized light as the light EL1. Accordingly, the light EL2 outputted from the second polarizer POL2 may be visible to the user USR.

Referring to FIG. 5B, the shutter glasses 300 may receive a private synchronization signal PV_Sync, and may close both the right eye shutter 300a and the left eye shutter 300b during a second private frame in response to the private synchronization signal PV_Sync. A closing of the right eye shutter 300a and the left eye shutter 300b may mean that the liquid crystal layers LCL' of the right eye shutter 300a and the left eye shutter 300b turn the vibration direction of the about 90 degree linearly polarized light EL1 by about 90 degrees to be about 180 degree linearly polarized.

The light EL1 passing through the liquid crystal layers LCL' of the right eye shutter 300a and the left eye shutter 300b may be incident on the second polarizer POL2. Since the second polarizer POL2 transmits a component that vibrates in the about 90 degree direction of the phase axis among light components, the about 180 degree linearly polarized light EL1 may not pass through the second polarizer POL2. Accordingly, the light EL1 may not be visible to the user USR.

Referring to FIG. 6A, the shutter glasses 300 may be for realizing private image display, and the shutter glasses 300 may allow a first private image IMG1 to be incident on right and left eyes of the user USR through the opening of the right eye shutter 300a and the left eye shutter 300b, and may prevent a second private image IMG2 from being incident on the right and left eyes of the user USR through the closing of the right eye shutter 300a and the left eye shutter 300b. The first private image IMG1 may be a normal image to be displayed on the display device 100, and the second private image IMG2 may be one of a black image, an inverted image of the first private image IMG1, and a noise image.

Accordingly, in case that the display device 100 is driven in the private mode, since the user USR recognizes the first private image IMG1 and does not recognize the second private image IMG2, the user USR may view the first private image IMG1.

The first private image IMG1 may correspond to the first private image data PV1 of FIG. 1, and the second private image IMG2 may correspond to the second private image data PV2 of FIG. 1.

The first private frame and the second private frame may be alternately provided in units of frames. In one embodiment, the unit frame may be 1 frame.

For example, in case that a driving frequency of the display device 100 is about 120 Hz, the first private frame in which the first private image IMG1 is provided and the second private frame in which the second private image IMG2 is provided may be alternately provided at cycles of about 240 Hz. In case that a driving frequency of the display device 100 is about 60 Hz, the first private frame in which the first private image IMG1 is provided and the second private frame in which the second private image IMG2 is provided may be alternately provided at cycles of about 120 Hz.

On the other hand, referring to FIG. 6B, in case that a surrounding person not wearing the shutter glasses 300 views the display device 100 driven in the private mode, since the surrounding person recognizes both the first private image IMG1 and the second private image IMG2, the surrounding person may view a third private image IMG3 in which the first private image IMG1 and the second private image IMG2 are mixed. FIG. 6B illustrates the second private image IMG2 as a black image. For this reason, since luminance of the third private image IMG3 is significantly lower than that of the first private image IMG1, the surrounding person not wearing the shutter glasses 300 cannot normally view the first private image IMG1 outputted from the display device 100. On the other hand, in case that the second private image IMG2 is set as an inverted image of the first private image IMG1, the third private image IMG3 may be recognized as a white image having significantly higher luminance than the first private image IMG1. In case that the second private image IMG2 is set as a noise image, the third private image IMG3 may be recognized as a noise image.

Hereinafter, other embodiments will be described below. In the following embodiment, a substantially identical or similar configuration to the above-described embodiments will be omitted or simplified, and differences will be mainly described.

Figure 7:
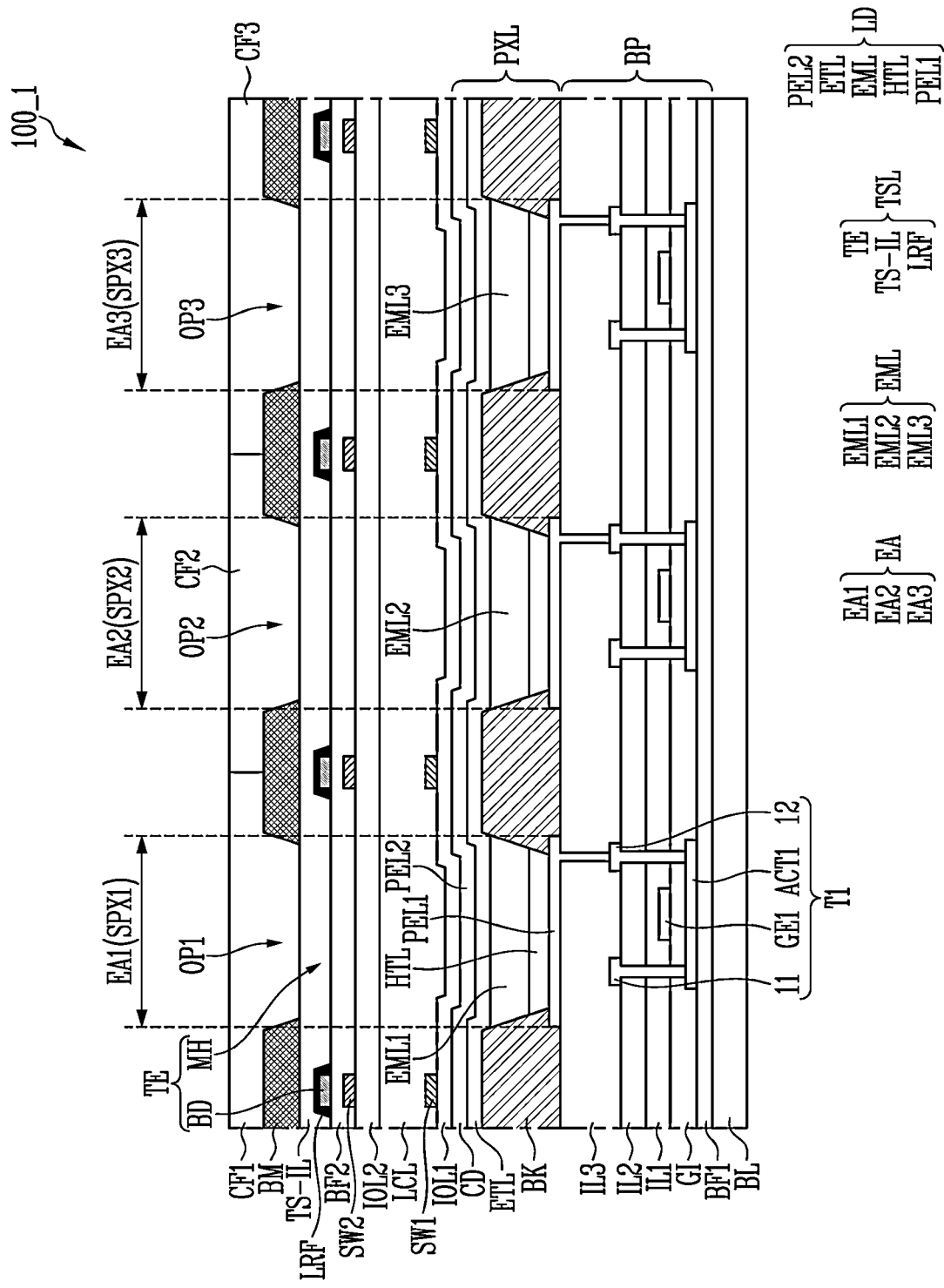
FIG. 7 illustrates a schematic cross-sectional view of another embodiment of a display device of FIG. 1.

FIG. 7 illustrates a schematic cross-sectional view of another embodiment of a display device of FIG. 1.

A display device 100_1 illustrated in FIG. 7 may be different from the display device 100 illustrated in FIG. 3 in that the display device 100_1 further includes color filters CF1, CF2, and CF3, and the remaining configurations thereof are substantially a same as those of the display device 100 illustrated in FIG. 3.

Referring to FIG. 3 and FIG. 7, the display device 100_1 may further include a black matrix BM and color filters CF1, CF2, and CF3 on the touch sensor layer TSL.

The black matrix BM may be provided on the touch insulating layer TS-IL. The black matrix BM may absorb or block light introduced from an outside. The black matrix BM may include an organic light blocking material. For example, the organic light blocking material may include at least one of a carbon black and a titan black, but is not limited thereto.

The black matrix BM may include openings OP1, OP2, and OP3. In an embodiment, the black matrix BM may be formed by a patterning process or a printing process using a mask.

The black matrix BM may be provided to overlap the bank layer BK in a plan view. The black matrix BM may be disposed to cover the conductive electrode TE of the touch sensor layer TSL. The black matrix BM may be disposed to avoid the light emitting areas EA1, EA2, and EA3. The black matrix BM may be provided in a form of a pattern including the first opening OP1 overlapping the first light emitting area EA1, the second opening OP2 overlapping the second light emitting area EA2, and the third opening OP3 overlapping the third light emitting area EA3, in a plan view.

Depending on a color of light emitted from the light emitting area EA, each of the color filters CF1, CF2, and CF3 may be one of a red color filter, a green color filter, and a blue color filter. For example, in case that red light is outputted from the first light emitting area EA1, the first color filter CF1 may be a red color filter; in case that green light is outputted from the second light emitting area EA2, the second color filter CF2 may be a green color filter; and in case that blue light is outputted from the third light emitting area EA3, the third color filter CF3 may be a blue color filter.

In an embodiment, the color filters CF1, CF2, and CF3 may contact (e.g., directly contact) at least some of upper and side surfaces of the black matrix BM. For example, the color filters CF1, CF2, and CF3 may be disposed (e.g., directly disposed) on the black matrix BM.

Figure 8:
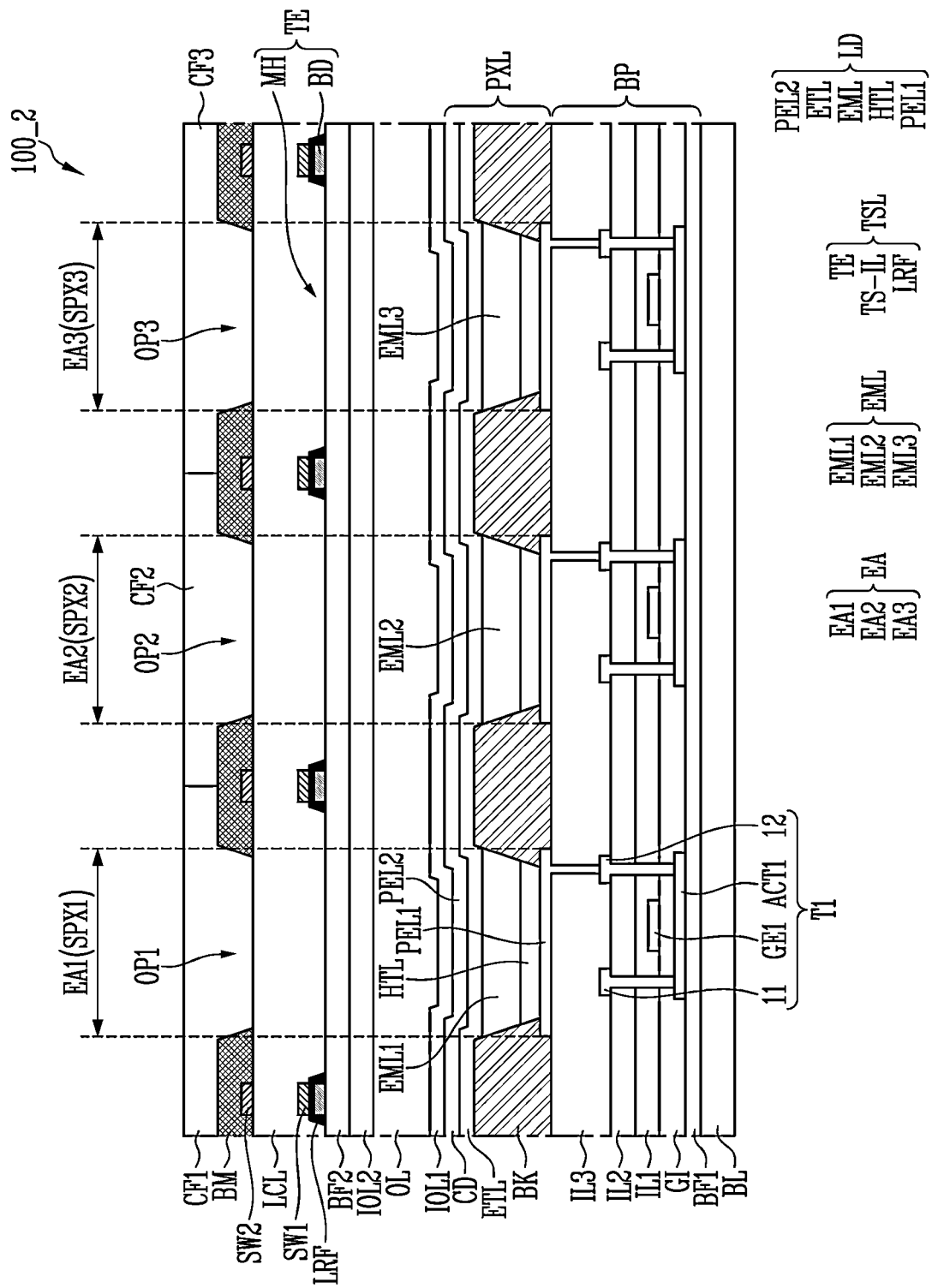
FIG. 8 illustrates a schematic cross-sectional view of another embodiment of a display device of FIG. 1.

FIG. 8 illustrates a schematic cross-sectional view of another embodiment of the display device of FIG. 1.

A display device 100_2 illustrated in FIG. 8 may be different from the display device 100_1 illustrated in FIG. 7 in that disposition positions of the first switch electrode SW1, the second switch electrode SW2, and the liquid crystal layer LCL are changed, except for the remaining configuration, but the remaining configurations are substantially a same as each other.

For example, the liquid crystal layer LCL of the display device 100_1 illustrated in FIG. 7 may be formed between the first inorganic insulating layer IOL1 and the second inorganic insulating layer IOL2. The first switch electrode SW1 may be formed on the first inorganic insulating layer IOL1 to overlap the bank layer BK in a thickness direction thereof (or in a plan view), and the second switch electrode SW2 may be formed on the second inorganic insulating layer IOL2 to face the first switch electrode SW1.

The liquid crystal layer LCL of the display device 100_2 illustrated in FIG. 8 may be formed between the second buffer layer BF2 and the color filters CF1, CF2, and CF3, and an organic insulating layer OL may be formed between the first inorganic insulating layer IOL1 and the second inorganic insulating layer IOL2. The first inorganic insulating layer IOL1, the organic insulating layer OL, and the second inorganic insulating layer IOL2 that are sequentially stacked with each other may function as an encapsulation layer sealing the pixel layer PXL. The first inorganic insulating layer IOL1 and the second inorganic insulating layer IOL2 may protect the pixel layer PXL from moisture or oxygen, and the organic insulating layer OL may protect the pixel layer PXL from foreign particles such as dust particles. The organic insulating layer OL may include an acryl-based organic insulating layer, but is not limited thereto. In an embodiment, an encapsulation layer may include a first inorganic insulating layer IOL1 disposed on the pixel layer PXL, an organic insulating layer OL disposed on the first inorganic insulating layer IOL1, and a second inorganic insulating layer IOL2 disposed on the organic insulating layer OL.

The first switch electrode SW1 may be formed on the low refractive index flat layer LRF to overlap the body portion BD of the touch electrode TE in a thickness direction thereof (or in a plan view), and the second switch electrode SW2 may be formed on the liquid crystal layer LCL to face the first switch electrode SW1. The second switch electrode SW2 may be covered by the black matrix BM.

Figure 9:
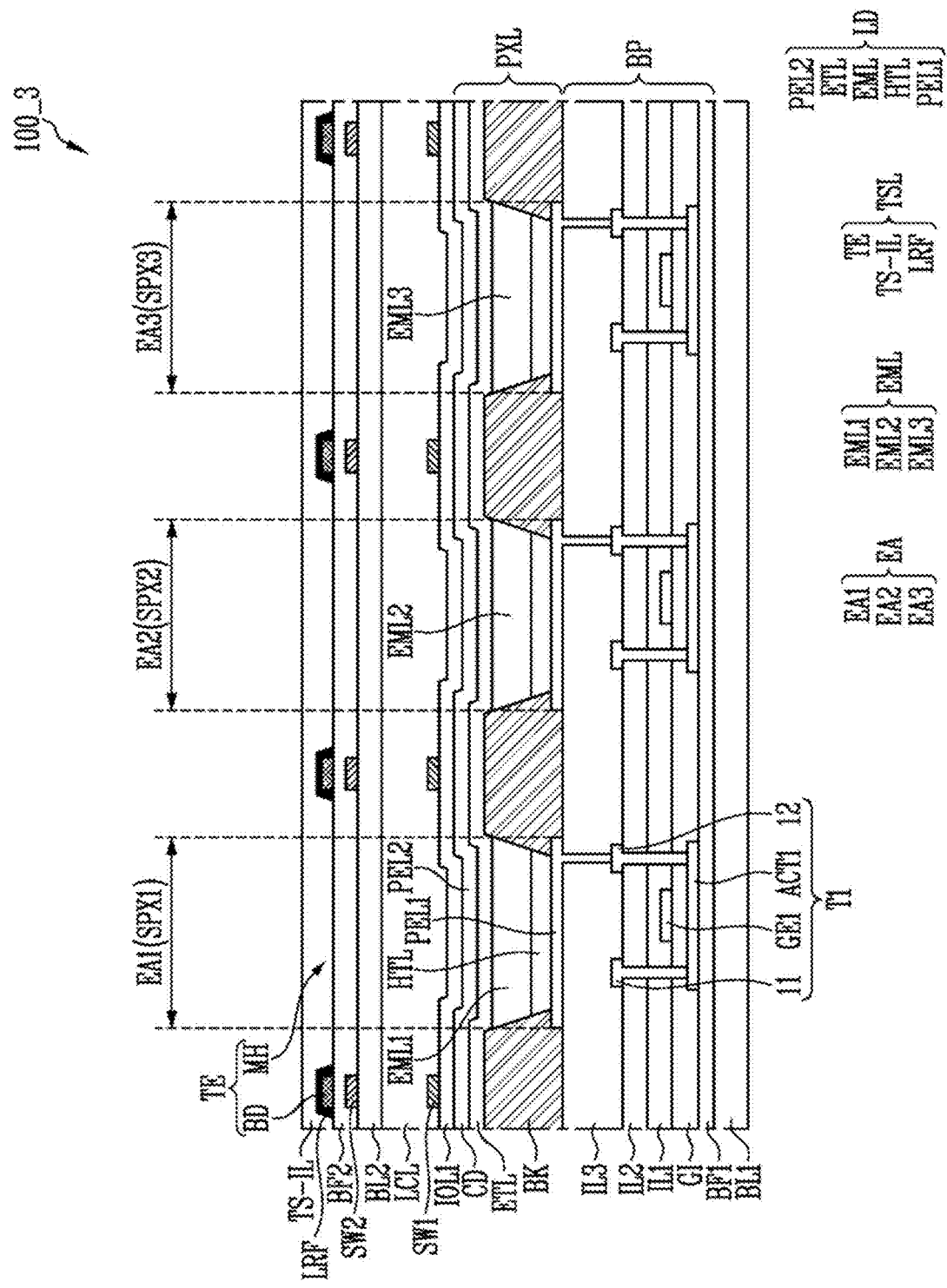
FIG. 9 illustrates a schematic cross-sectional view of another embodiment of a display device of FIG. 1.

FIG. 9 illustrates a schematic cross-sectional view of another embodiment of the display device of FIG. 1.

A display device 100_3 illustrated in FIG. 9 may be different from the display device 100 illustrated in FIG. 3 in which the base substrate (or base layer) BL is a flexible substrate and the second inorganic insulating layer IOL2 is disposed on a surface of the liquid crystal layer LCL in that a base substrate BL1 is a rigid substrate and an encapsulation substrate BL2 is disposed on a surface of the liquid crystal layer LCL, but the remaining components are substantially a same as each other.

The base substrate BL1 and the encapsulation substrate BL2 may be made of a transparent insulating material such as glass and quartz. Accordingly, the encapsulation substrate BL2 may transmit light emitted from the light emitting layer EML.

Figure 10:
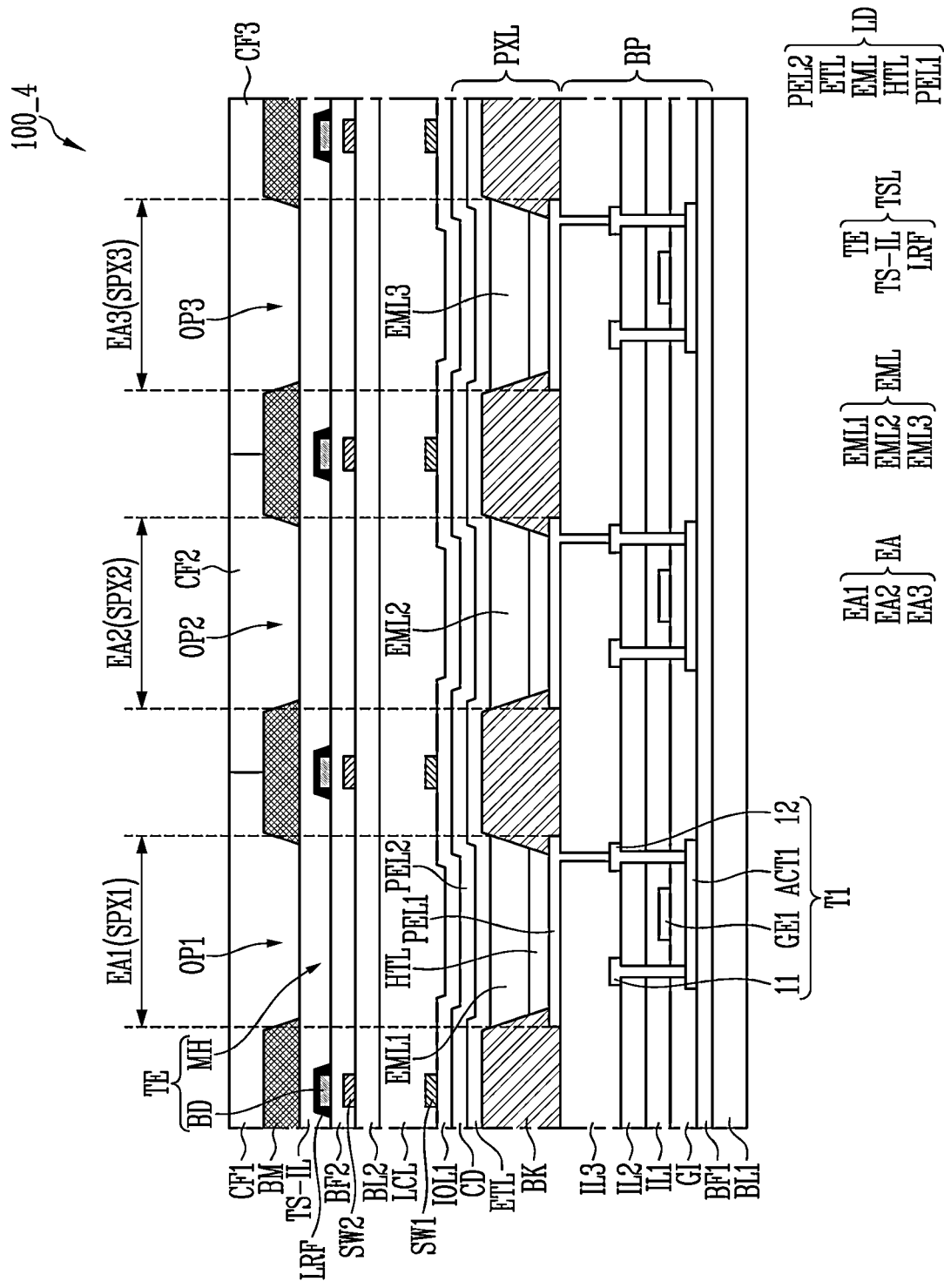
FIG. 10 illustrates a schematic cross-sectional view of another embodiment of a display device of FIG. 1.

FIG. 10 illustrates a schematic cross-sectional view of another embodiment of the display device of FIG. 1.

A display device 100_4 illustrated in FIG. 10 may be different from the display device 10_1 illustrated in FIG. 7 in which the base substrate BL is a flexible substrate and the second inorganic insulating layer IOL2 is disposed on a surface of the liquid crystal layer LCL in that a base substrate BL1 is a rigid substrate and an encapsulation substrate BL2 is disposed on a surface of the liquid crystal layer LCL, but the remaining components are substantially a same as each other.

The base substrate BL1 and the encapsulation substrate BL2 may be made of a transparent insulating material such as glass and quartz. Accordingly, the encapsulation substrate BL2 may transmit light emitted from the light emitting layer EML.

As described above, the display devices 100_1, 100_2, 100_3, and 100_4 illustrated in FIG. 7 to FIG. 10 may have some configurations different from those of the display device 100 illustrated in FIG. 3, but may provide substantially a same effect in that they convert the light that is emitted from the light emitting layer EML to vibrate in all directions into about 90 degree linearly polarized light by using the liquid crystal layer LCL in the private mode.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device selectively driven in a general mode or a private mode, comprising:
   a base substrate;
   a pixel layer disposed on the base substrate;
   a first inorganic insulating layer disposed directly on the pixel layer;
   a first switch electrode disposed on the first inorganic insulating layer;
   a liquid crystal layer disposed directly on a surface of the first inorganic insulating layer and directly on a surface of the first switch electrode;
   a second inorganic insulating layer disposed on the liquid crystal layer; and
   a second switch electrode disposed on the second inorganic insulating layer to face the first switch electrode, wherein
   the liquid crystal layer converts light emitted from the pixel layer into about 90 degree linearly polarized light by an electric field formed between the first switch electrode and the second switch electrode in the private mode.

2. The display device of claim 1, wherein
   the pixel layer includes a pixel defining film partitioning a first light emitting area, a second light emitting area, and a third light emitting area.

3. The display device of claim 2, wherein the first switch electrode and the second switch electrode overlap the pixel defining film in a thickness direction of the pixel defining film.

4. The display device of claim 1, further comprising:
   a touch sensor layer on the second inorganic insulating layer.

5. The display device of claim 4, wherein the touch sensor layer includes:
   a touch electrode,
   a low refractive index flat layer covering the touch electrode, and
   a touch insulating layer disposed on the touch electrode and the low refractive index flat layer.

6. The display device of claim 5, wherein a refractive index of the low refractive index flat layer is smaller than a refractive index of the touch insulating layer.

7. The display device of claim 5, further comprising:
   a buffer layer covering the second switch electrode between the second inorganic insulating layer and the touch sensor layer.

8. The display device of claim 4, further comprising:
   a black matrix and
   a color filter on the touch sensor layer, wherein
   the first switch electrode and the second switch electrode overlap the black matrix in a thickness direction of the black matrix.

9. The display device of claim 1, wherein
   the pixel layer includes multiple pixels, both the first switch electrode and the second switch electrode overlap the multiple pixels in a thickness direction of the base substrate, and when electric field is formed between the first switch electrode and the second switch electrode, liquid crystal molecules of the liquid crystal layer have a constant direction over all the multiple pixels.

10. The display device of claim 1, wherein when no electric field is formed between the first switch electrode and the second switch electrode, light exiting a top surface of the display device vibrates in all directions, and when an electric field is formed between the first switch electrode and the second switch electrode, light exiting a top surface of the display device vibrates in about one direction.

\* \* \* \* \*